US012660130B2

(12) United States Patent
Xu et al.

(10) Patent No.: US 12,660,130 B2
(45) Date of Patent: Jun. 16, 2026

(54) SMALL FORM FACTOR TRANSCEIVER MODULE

(71) Applicant: BIZLINK INTERNATIONAL CORP., New Taipei City (TW)

(72) Inventors: Zhaojun Xu, New Taipei City (TW); Jinhua Meng, New Taipei City (TW)

(73) Assignee: BIZLINK INTERNATIONAL CORP., New Taipei City (TW)

( * ) Notice: Subject to any disclaimer, the term of this patent is extended or adjusted under 35 U.S.C. 154(b) by 236 days.

(21) Appl. No.: 18/438,509

(22) Filed: Feb. 11, 2024

(65) Prior Publication Data

US 2025/0261341 A1     Aug. 14, 2025

(51) Int. Cl.
H05K 7/20 (2006.01)
G02B 6/42 (2006.01)

(52) U.S. Cl.
CPC ....... H05K 7/20436 (2013.01); G02B 6/4269 (2013.01); H05K 7/20463 (2013.01)

(58) Field of Classification Search
CPC ............ G02B 6/4269; H05K 7/20436; H05K 7/20463
See application file for complete search history.

(56) References Cited

U.S. PATENT DOCUMENTS

| | | | | |
|---|---|---|---|---|
| 5,057,909 A | * | 10/1991 | Mok | H01L 23/147 257/E23.008 |
| 5,169,805 A | * | 12/1992 | Mok | H01L 23/42 29/841 |
| 7,005,029 B2 | * | 2/2006 | Khan | B01L 3/5085 156/291 |
| 7,279,063 B2 | * | 10/2007 | Yokajty | H10K 59/8722 156/275.7 |
| 7,514,785 B2 | * | 4/2009 | Toba | H05K 3/3452 257/713 |
| 7,821,113 B2 | * | 10/2010 | Sahasrabudhe | ... H01L 23/49503 257/666 |
| 8,154,109 B2 | * | 4/2012 | Sahasrabudhe | ... H01L 23/49503 257/E23.037 |
| 10,782,569 B2 | * | 9/2020 | Hu | G02F 1/13394 |
| 10,921,536 B2 | * | 2/2021 | Park | G02B 6/4284 |
| 10,942,323 B1 | * | 3/2021 | Togami | F28F 1/14 |
| 2005/0173059 A1 | * | 8/2005 | Ringleben | B29C 65/524 156/291 |
| 2006/0215369 A1 | * | 9/2006 | Ohashi | H01L 23/467 257/E23.09 |

(Continued)

FOREIGN PATENT DOCUMENTS

| | | |
|---|---|---|
| CN | 205681705 U | 11/2016 |
| CN | 217238465 U | 8/2022 |

(Continued)

*Primary Examiner* — Robert J Hoffberg

(74) *Attorney, Agent, or Firm* — CKC & Partners Co., LLC

(57)     ABSTRACT

A small form factor transceiver module includes a base, a printed circuit board, a cover, a heatsink and an adhesive. The printed circuit board has a connecting terminal. The printed circuit board is sandwiched between the base and the cover. The cover has at least one first groove and a mounting surface away from the printed circuit board. The first groove is located on the mounting surface. The adhesive is connected between the mounting surface and the heatsink. The first groove is configured to accommodate an excessive portion of the adhesive.

15 Claims, 9 Drawing Sheets

(56)     References Cited

U.S. PATENT DOCUMENTS

2007/0285897 A1 * 12/2007 Huang ................. H01L 23/427
                                                    257/E23.088
2018/0338387 A1    11/2018 Park et al.
2023/0311791 A1    10/2023 Yamanaka
2025/0048530 A1 *   2/2025 Liao .................... H05K 1/0203

FOREIGN PATENT DOCUMENTS

CN         116056399  A      5/2023
JP         H0621255   A   *  1/1994
TW          M648515   U     11/2023
WO        2022193733  A1     9/2022

* cited by examiner

100

140

150

132

G1

133

131

G2

132

MS

133

121

120

110

DT

160

SMALL FORM FACTOR TRANSCEIVER MODULE

BACKGROUND

Technical Field

The present disclosure relates to small form factor transceiver modules. More particularly, the present disclosure relates to octal small form-factor pluggable (OSFP) transceiver modules.

Description of Related Art

In the US patent publication US20180338387A1, an octal small form-factor pluggable (OSFP) transceiver module 226 is disclosed. The OSFP transceiver module 226 includes an upper heat sink 212 and an upper housing member 206. The upper heat sink 212 with fins 214, and cover 216 are integrated with the upper housing member 206, as could be formed by extruding aluminum or other material or building up from separate pieces to an assembly held together by fasteners, bonding, or combination thereof. However, when the upper heat sink 212 and the cover 216 are not formed by aluminum extrusion, it becomes difficult to securely fix the upper heat sink 212 to the cover 216.

SUMMARY

A technical aspect of the present disclosure is to provide a small form factor transceiver module, which can securely fix the heat sink to the cover by preventing any excessive adhesive from being squeezed out of the space between the cover and the heat sink, thereby maintaining a good appearance of the small form factor transceiver module.

According to an embodiment of the present disclosure, a small form factor transceiver module includes a base, a printed circuit board, a cover, a heatsink and an adhesive. The printed circuit board has a connecting terminal. The printed circuit board is sandwiched between the base and the cover. The cover has at least one first groove and a mounting surface away from the printed circuit board. The first groove is located on the mounting surface. The adhesive is connected between the mounting surface and the heatsink. The first groove is configured to accommodate an excessive portion of the adhesive.

In one or more embodiments of the present disclosure, the first groove extends in a first direction. The cover further has at least one second groove located on the mounting surface. The second groove extends in a second direction intersecting with the first direction. The second groove is configured to accommodate another excessive portion of the adhesive.

In one or more embodiments of the present disclosure, the first groove intersects with the second groove.

In one or more embodiments of the present disclosure, the first groove is separated from the second groove.

In one or more embodiments of the present disclosure, the cover includes a body, two sidewalls and at least one stopper. The mounting surface is located on the body. The sidewalls are connected with the body. The mounting surface is located between the sidewalls. The sidewalls are configured to abut against the heatsink. The stopper is disposed on the mounting surface and located between the sidewalls. The stopper is configured to abut against the heatsink.

In one or more embodiments of the present disclosure, the stopper is separated from the sidewalls.

In one or more embodiments of the present disclosure, the stopper is connected with at least one of the sidewalls.

In one or more embodiments of the present disclosure, a quantity of the stopper is two. The first groove and the second groove are located between the stoppers.

In one or more embodiments of the present disclosure, the heatsink includes a bottom plate, a top plate and a plurality of fins. The adhesive is connected between the mounting surface and the bottom plate. The fins are separated from each other and connected between the bottom plate and the top plate. A width of the top plate is greater than a width of the bottom plate. Both of the top plate and the bottom plate are separated from both of the sidewalls.

In one or more embodiments of the present disclosure, the bottom plate of the heat sink is separated from both of the sidewalls by a plurality of side protrusions connecting to inner sides of the sidewalls.

In one or more embodiments of the present disclosure, the bottom plate has a first thickness. The stopper has a second thickness. The first thickness is equal to or larger than the second thickness.

According to an embodiment of the present disclosure, a small form factor transceiver module includes a base, a printed circuit board, a cover, a heatsink and an adhesive. The printed circuit board has a connecting terminal. The printed circuit board is sandwiched between the base and the cover. The cover has a mesh of grooves and a mounting surface away from the printed circuit board. The grooves are located on the mounting surface. The adhesive is connected between the mounting surface and the heatsink. The grooves are configured to accommodate an excessive portion of the adhesive.

In one or more embodiments of the present disclosure, the cover includes a body, two sidewalls and two stoppers. The mounting surface is located on the body. The sidewalls are connected with the body. The stoppers are disposed on the mounting surface forming an enclosure around the mounting surface with the sidewalls. A width of the top plate is greater than a width of the bottom plate. Both of the top plate and the bottom plate are separated from both of the sidewalls.

In one or more embodiments of the present disclosure, at least one of the stoppers is separated from the sidewalls.

In one or more embodiments of the present disclosure, at least one of the stoppers is connected with one of the sidewalls.

In one or more embodiments of the present disclosure, the heatsink includes a bottom plate, a top plate and a plurality of fins. The adhesive is connected between the mounting surface and the bottom plate. The fins are separated from each other and connected between the bottom plate and the top plate. The bottom plate, the top plate and the fins are one piece formed. A width of the top plate is greater than a width of the bottom plate. Both of the top plate and the bottom plate are separated from both of the sidewalls by a plurality of side protrusions connecting to inner sides of the sidewalls.

In one or more embodiments of the present disclosure, the bottom plate has a first thickness. The stopper has a second thickness. The first thickness is equal to or larger than the second thickness.

In one or more embodiments of the present disclosure, the connecting terminal points to an installing direction. The small form factor transceiver module further includes a latch. The latch is connected with an end of the base opposite to the installing direction.

In one or more embodiments of the present disclosure, the grooves are arranged in a pattern of grids.

The above-mentioned embodiments of the present disclosure have at least the following advantage: when too much of the adhesive is used between the cover and the heatsink, an excessive portion of the adhesive will be accommodated within the first groove and the second groove. This means the excessive portion of the adhesive can be prevented from being squeezed out of the space between the cover and the heatsink. Therefore, the small form factor transceiver module can maintain a good appearance.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
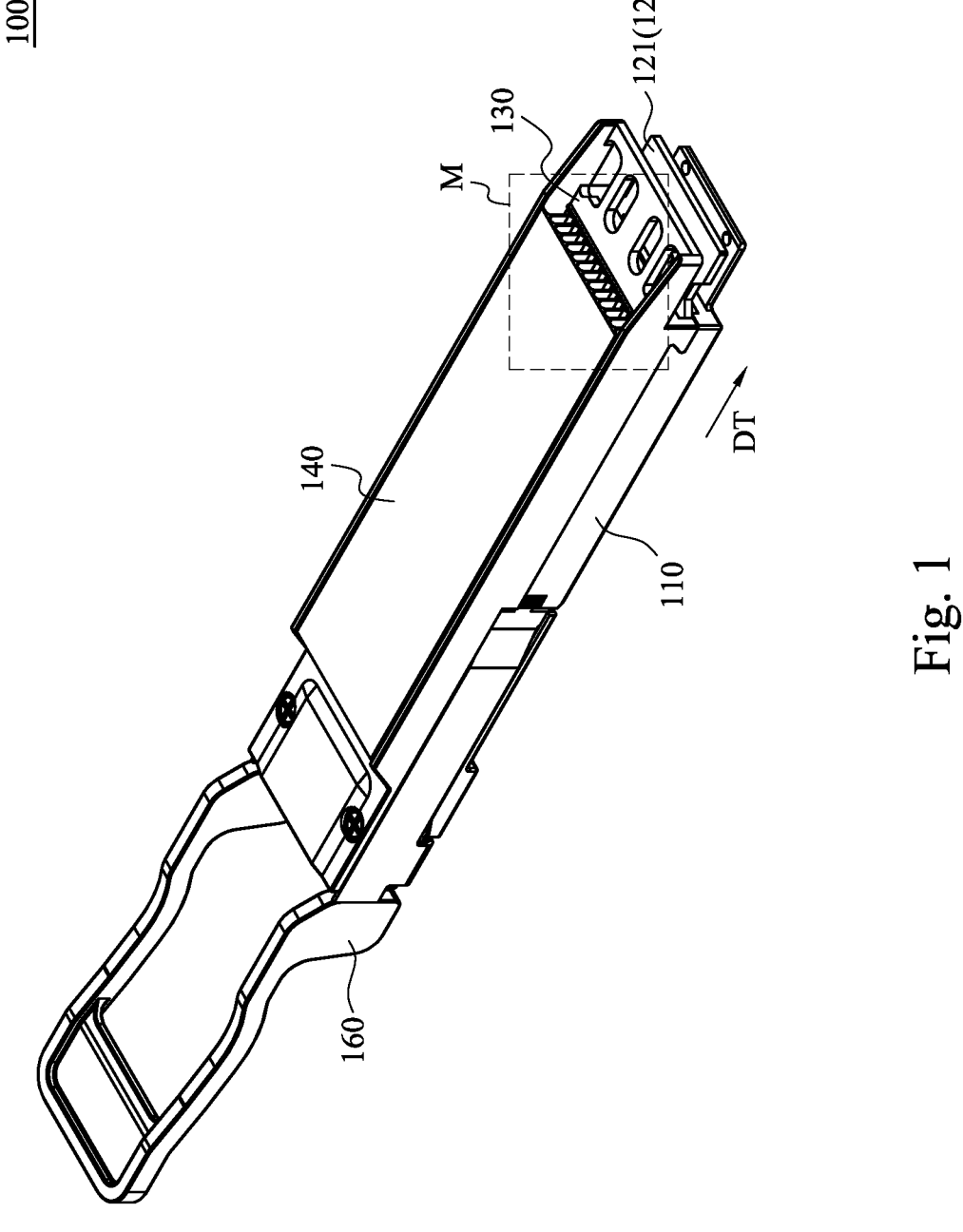
FIG. 1 is a schematic view of a small form factor transceiver module according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-8 are drawn according to the actual scale. For the sake of concise description in this specification, the scales of the elements are not listed one by one. However, the scale and position of each element should be regarded as part of the scope of this specification.

Furthermore, if the description in this specification is insufficient to explain the detailed design of the elements and makes it uneasy to implement, please take the octal small form-factor pluggable (OSFP) transceiver module disclosed in the US Patent publication US20180338387A1 as a reference.

As shown in FIGS. 1-8, a small form factor transceiver module 100 is provided in the present disclosure. Moreover, for example, the small form factor transceiver module 100 is applied to connect a network device, such as a switch, to fiber or copper cable.

Figure 2:
FIG. 2 is an exploded view of the small form factor transceiver module of FIG. 1.

FIG. 1 is a schematic view of a small form factor transceiver module 100 according to an embodiment of the present disclosure. FIG. 2 is an exploded view of the small form factor transceiver module 100 of FIG. 1. In this embodiment, as shown in FIGS. 1-2, the small form factor transceiver module 100 includes a base 110, a printed circuit board 120, a cover 130, a heatsink 140, an adhesive 150 and a latch 160. When applied, the adhesive 150 is in a liquid form. For an easy understanding of the internal structure of the small form factor transceiver module 100, the adhesive 150 is presented as a layer in FIG. 2.

Figure 3:
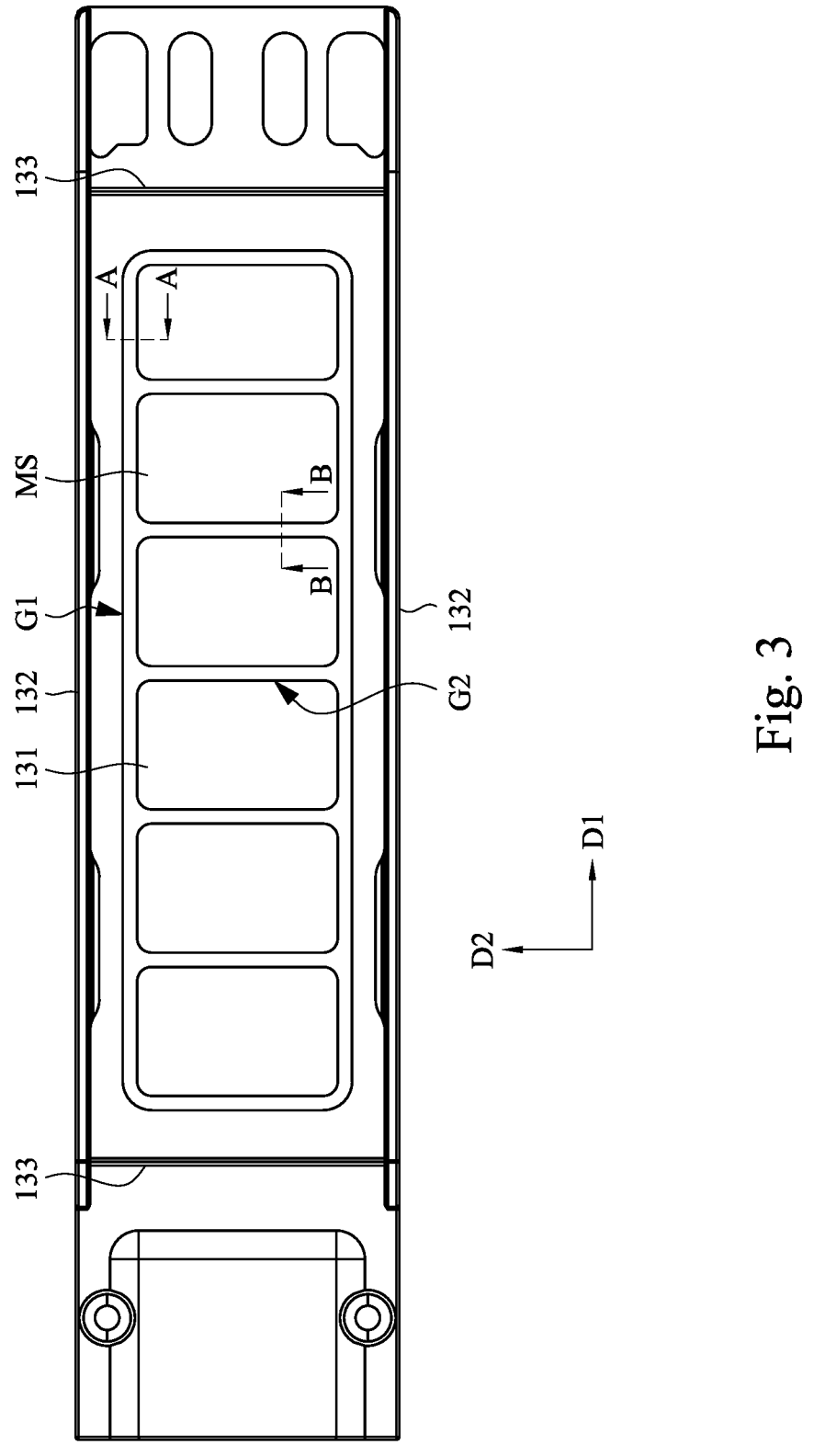
FIG. 3 is a top view of the cover of FIG. 1.
Figures 4, 5:
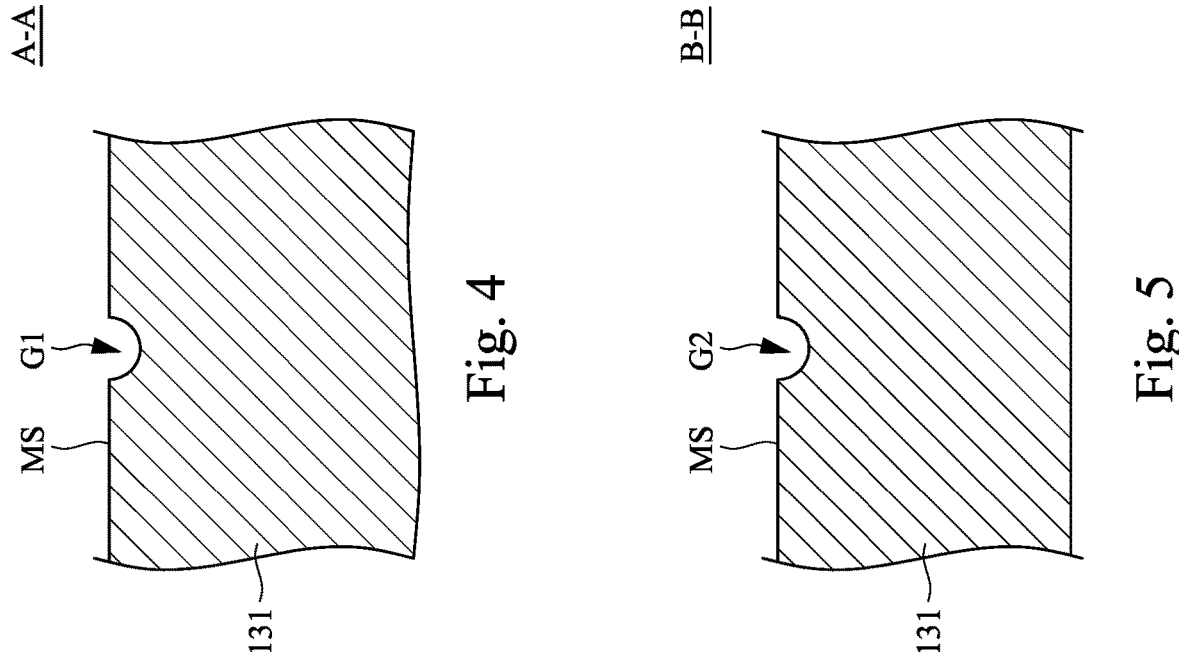
FIG. 4 is a sectional view along the sectional line A-A of FIG. 3.
FIG. 5 is a sectional view along the sectional line B-B of FIG. 3.

FIG. 3 is a top view of the cover 130 of FIG. 1. FIG. 4 is a sectional view along the sectional line A-A of FIG. 3. FIG. 5 is a sectional view along the sectional line B-B of FIG. 3. As shown in FIGS. 2-5, the cover 130 includes a body 131, two sidewalls 132 and at least one stopper 133. The sidewalls 132 are connected with the body 131. Moreover, the cover 130 has at least one first groove G1, at least one second groove G2 and a mounting surface MS. For example, as shown in FIGS. 3-4, a quantity of the first groove G1 is plural while a quantity of the second groove G2 is also plural. The mounting surface MS is located on the body 131 and between the sidewalls 132. Moreover, as shown in FIGS. 3-4, a quantity of the stopper 133 is two. The stoppers 133 are disposed on the mounting surface MS and located between the sidewalls 132 to form with the sidewalls 132 an enclosure around the mounting surface MS. At least one of the stoppers 133 is connected with at least one of the sidewalls 132. The first grooves G1 and the second grooves G2 are located on the mounting surface MS and between the stoppers 133. Each of the first grooves G1 extends in a first direction D1. Each of the second grooves G2 extends in a second direction D2 intersecting with the first direction D1. For example, the second direction D2 is perpendicular to the first direction D1. In this embodiment, each of the first grooves G1 intersects with at least one of the second grooves G2, such that the first grooves G1 and the second grooves G2 are arranged in a pattern of grids. In other words, the cover 130 has a mesh of grooves (i.e., the first grooves G1 and the second grooves G2) located on the mounting surface MS.

Figure 6:
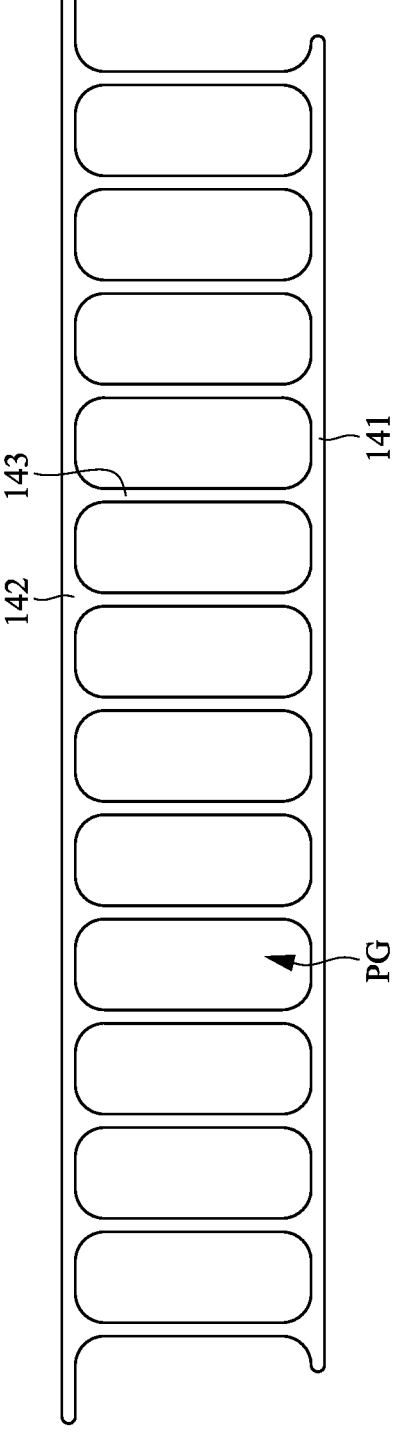
FIG. 6 is a front view of the heatsink of FIG. 1.

FIG. 6 is a front view of the heatsink 140 of FIG. 1. In this embodiment, as shown in FIG. 6, the heatsink 140 includes a bottom plate 141, a top plate 142 and a plurality of fins 143. The fins 143 are separated from each other and connected between the bottom plate 141 and the top plate 142. Adjacent two of the fins 143 define a passage PG therebetween to allow air to flow through for heat dissipation. In practice, the bottom plate 141, the top plate 142 and the fins 143 are one piece formed. It is worth to note that, in this embodiment, a quantity of the fins 143 is between 12 and 14 inclusively, such that a larger amount of surface area is provided by the fins 143 while a size of each of the passages PG can be maintained in an appropriate magnitude, leading to a better effect of heat dissipation. As shown in FIG. 6, for example, the quantity of the fins 143 is 13. In addition, a width of the top plate 142 is greater than a width of a bottom plate 141.

As shown in FIGS. 1-2, the printed circuit board 120 has a connecting terminal 121. The connecting terminal 121 points to an installing direction DT and is configured to electrically connect with a network device (not shown), for example. The latch 160 is connected with an end of the base 110 opposite to the installing direction DT. The printed circuit board 120 is sandwiched between the base 110 and the cover 130. The mounting surface MS is located on a side of the cover 130 away from the printed circuit board 120. The adhesive 150 is connected between the mounting surface MS and the heatsink 140 in order to stick together the mounting surface MS and the heatsink 140. To be more specific, the adhesive 150 is connected between the mounting surface MS of the cover 130 and the bottom plate 141 (please see FIG. 6 for the bottom plate 141) of the heatsink 140. The sidewalls 132 and the stoppers 133 are configured to abut against the heatsink 140. In other words, the sidewalls 132 and the stoppers 133 are configured to restrict the position of the heatsink 140.

It is worth to note that, in this embodiment, the first grooves G1 and the second grooves G2 are configured to accommodate an excessive portion of the adhesive 150. In practice, when too much of the adhesive 150 is used between the cover 130 and the heatsink 140, an excessive portion of the adhesive 150 will be accommodated within the first grooves G1 and the second grooves G2. This means the excessive portion of the adhesive 150 can be prevented from being squeezed out of the space between the cover 130 and the heatsink 140. Therefore, the small form factor transceiver module 100 can maintain a good appearance.

Figure 7A:
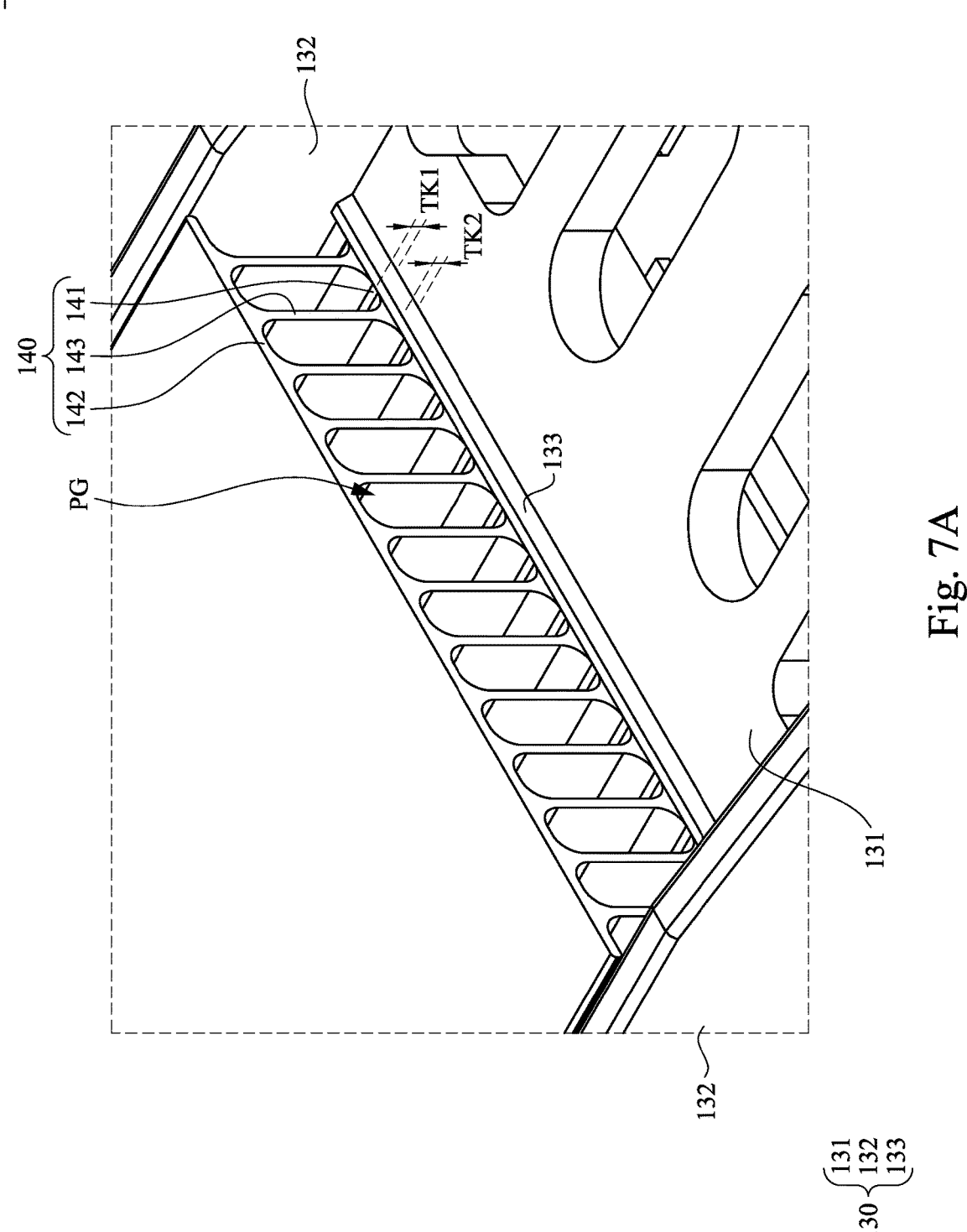
FIG. 7A is an enlarged view of zone M of FIG. 1.
Figure 7B:
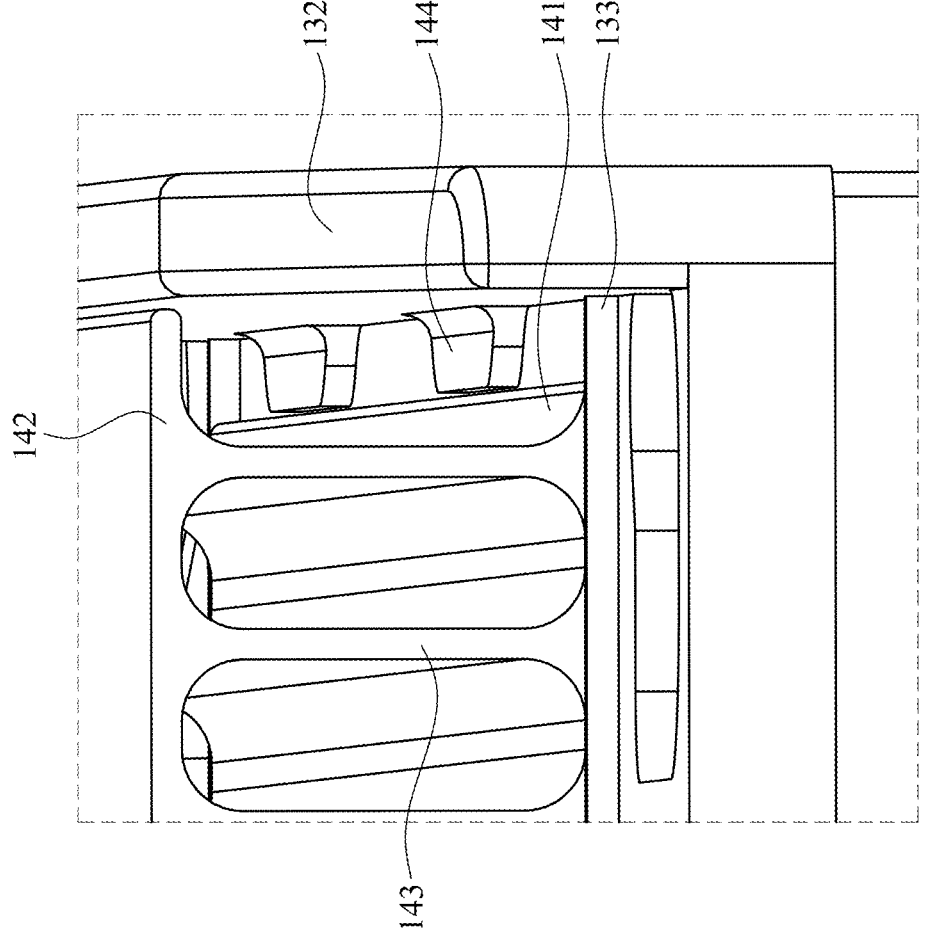
FIG. 7B is an enlarged view of the structure in FIG. 7A.

FIG. 7A is an enlarged view of zone M of FIG. 1. FIG. 7B is an enlarged view of the structure in FIG. 7A. As shown in FIGS. 7A and 7B, the bottom plate 141 has a first thickness TK1. The stopper 133 has a second thickness TK2. In this embodiment, the first thickness TK1 of the bottom plate 141 of the heatsink 140 is equal to or larger than the second thickness TK2 of the stopper 133. In this way, the passages PG defined by the fins 143 will be free from blockage by the stopper 133. Thus, the air flowing through the passages PG will not be affected by the stopper 133. For example, as shown in FIG. 7A, the first thickness TK1 of the bottom plate 141 of the heatsink 140 is equal to the second thickness TK2 of the stopper 133. In addition, as shown in FIG. 7B, both of the top plate 142 and the bottom plate 141 are separated from both of the sidewalls 132. Specifically, the heatsink 140 further includes a plurality of side protrusions 144. The side protrusions 144 are connected to inner sides of the sidewalls 132. The bottom plate 141 of the heat sink 140 is separated from both of the sidewalls 132 by the side protrusions 144.

Figure 8:
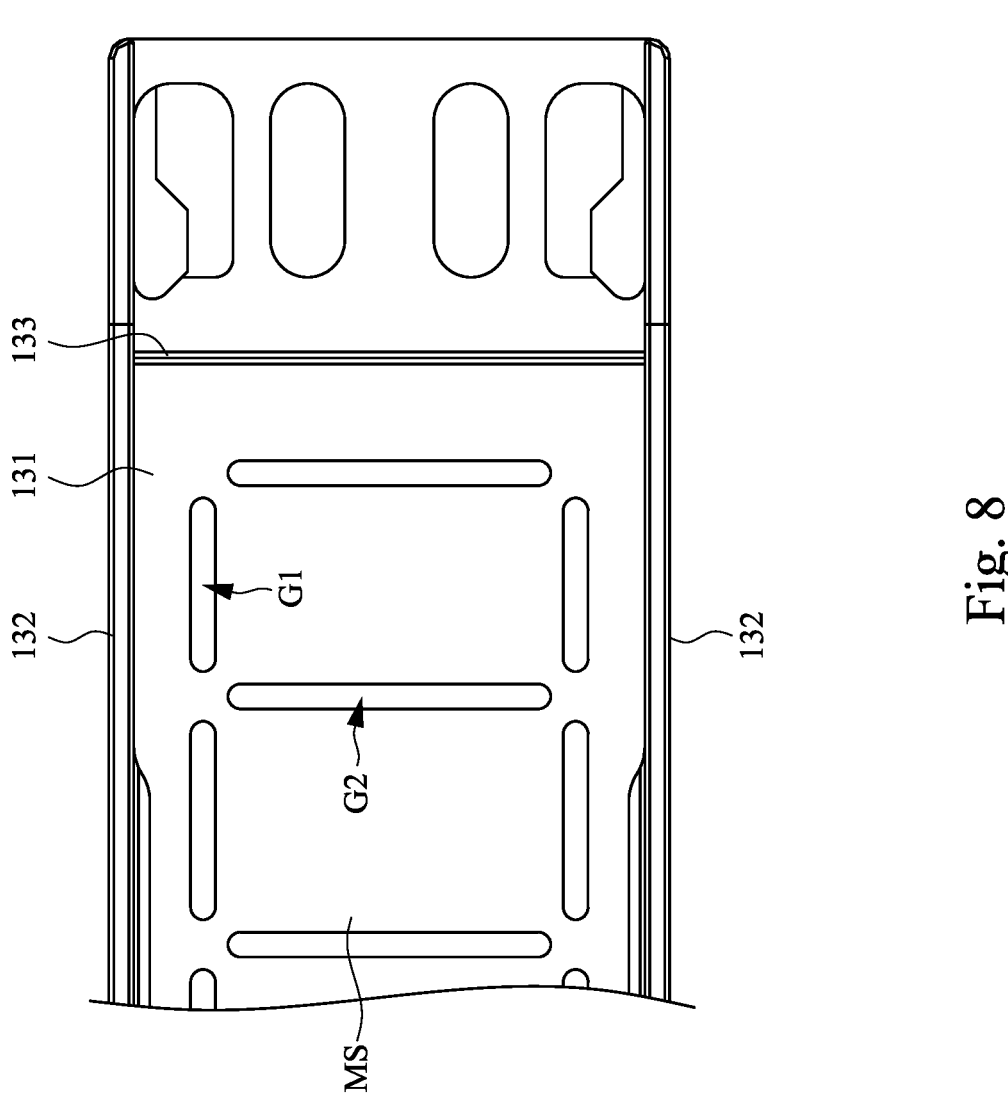
FIG. 8 is a partially enlarged top view of a cover according to another embodiment of the present disclosure.

FIG. 8 is a partially enlarged top view of a cover 130 according to another embodiment of the present disclosure. In this embodiment, as shown in FIG. 8, each of the first grooves G1 is separated from the second grooves G2, according to the actual situation.

Figure 9:
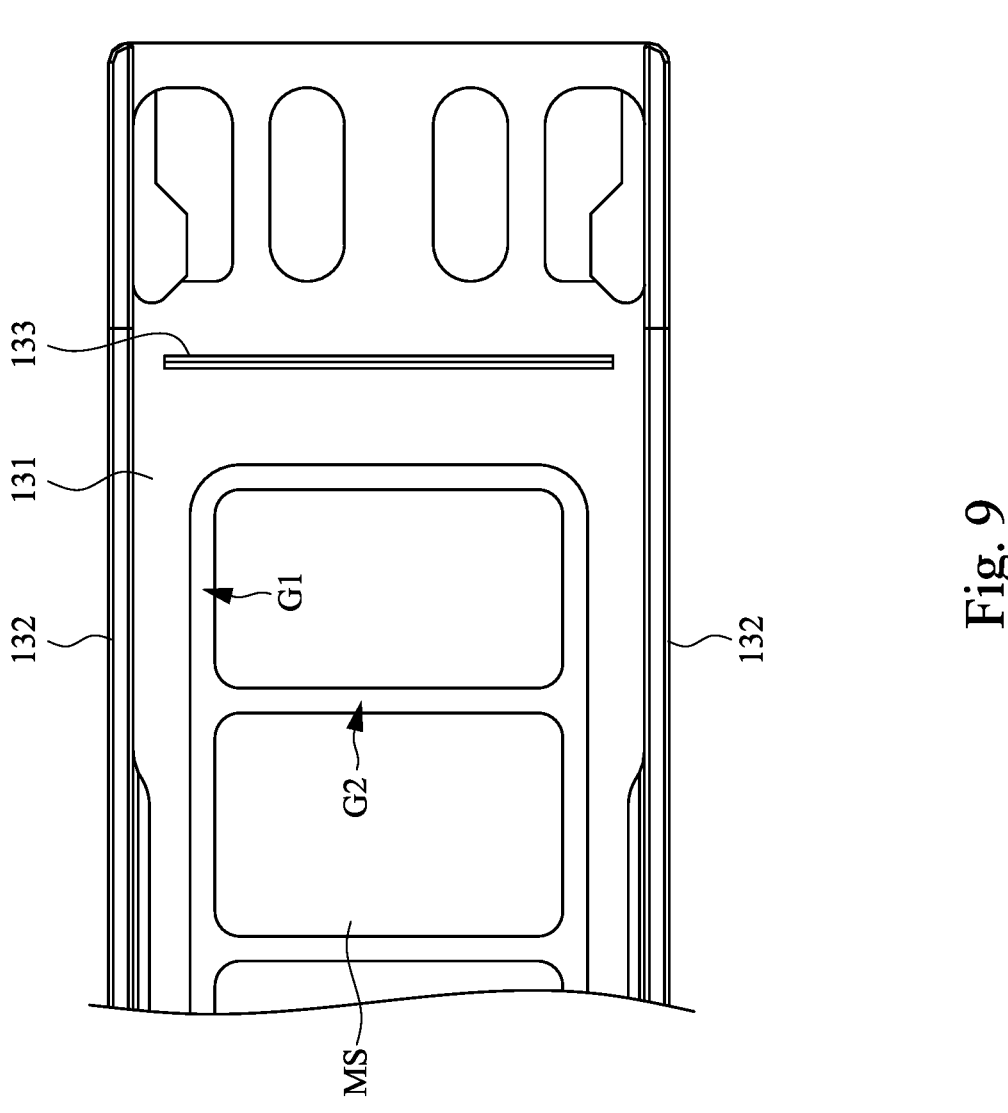
FIG. 9 is a partially enlarged top view of a cover according to a further embodiment of the present disclosure.

FIG. 9 is a partially enlarged top view of a cover 130 according to a further embodiment of the present disclosure. In this embodiment, as shown in FIG. 9, at least one of the stoppers 133 is separated from the sidewalls 132, according to the actual situation.

In conclusion, the aforementioned embodiments of the present disclosure have at least the following advantage: when too much of the adhesive is used between the cover and the heatsink, an excessive portion of the adhesive will be accommodated within the first grooves and the second grooves. This means the excessive portion of the adhesive can be prevented from being squeezed out of the space between the cover and the heatsink. Therefore, the small form factor transceiver module can maintain a good appearance.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A small form factor transceiver module, comprising:
   a base;
   a printed circuit board having a connecting terminal;
   a cover, the printed circuit board being sandwiched between the base and the cover, the cover having at least one first groove, at least one second groove, and a mounting surface away from the printed circuit board, the at least one first groove and the at least one second groove being located on the mounting surface;
   a heatsink; and
   an adhesive connected between the mounting surface and the heatsink,
   wherein the at least one first groove is configured to accommodate an excessive portion of the adhesive,
   wherein the at least one first groove extends in a first direction, the at least one second groove extends in a second direction intersecting with the first direction, and the at least one second groove is configured to accommodate another excessive portion of the adhesive,
   wherein the cover comprises:
      a body, the mounting surface is located on the body;
      two sidewalls connected with the body, the mounting surface is located between the two sidewalls, the two sidewalls are configured to abut against the heatsink; and
      at least one stopper disposed on the mounting surface and located between the two sidewalls, the at least one stopper is configured to abut against the heatsink.

2. The small form factor transceiver module of claim 1, wherein the at least one first groove intersects with the at least one second groove.

3. The small form factor transceiver module of claim 1, wherein the at least one first groove is separated from the at least one second groove.

4. The small form factor transceiver module of claim 1, wherein the at least one stopper is separated from the two sidewalls.

5. The small form factor transceiver module of claim 1, wherein the at least one stopper is connected with at least one of the two sidewalls.

6. The small form factor transceiver module of claim 1, wherein a quantity of the at least one stopper is two, the at least one first groove and the at least one second groove are located between the stoppers.

7. A small form factor transceiver module, comprising:
   a base;
   a printed circuit board having a connecting terminal;
   a cover, the printed circuit board being sandwiched between the base and the cover, the cover having at least one first groove and a mounting surface away from the printed circuit board, the at least one first groove being located on the mounting surface;

a heatsink; and an adhesive connected between the mounting surface and the heatsink, wherein the at least one first groove is configured to accommodate an excessive portion of the adhesive, wherein the cover comprises a body and two sidewalls connected with the body, and the mounting surface is located on the body, wherein the heatsink comprises:

a bottom plate, the adhesive is connected between the mounting surface and the bottom plate;

a top plate; and a plurality of fins separated from each other and connected between the bottom plate and the top plate, wherein a width of the top plate is greater than a width of the bottom plate, and both of the top plate and the bottom plate are separated from both of the two sidewalls.

8. The small form factor transceiver module of claim 7, wherein the bottom plate of the heatsink is separated from both of the two sidewalls by a plurality of side protrusions connecting to inner sides of the two sidewalls.

9. A small form factor transceiver module, comprising:

a base;

a printed circuit board having a connecting terminal;

a cover, the printed circuit board being sandwiched between the base and the cover, the cover having a mesh of grooves and a mounting surface away from the printed circuit board, the mesh of grooves being located on the mounting surface;

a heatsink; and an adhesive connected between the mounting surface and the heatsink, wherein the mesh of grooves is configured to accommodate an excessive portion of the adhesive, wherein the cover comprises:

a body, the mounting surface is located on the body;

two sidewalls connected with the body; and two stoppers disposed on the mounting surface forming an enclosure around the mounting surface with the two sidewalls, wherein the heatsink comprises a bottom plate and a top plate, a width of the top plate is greater than a width of the bottom plate, and both of the top plate and the bottom plate are separated from both of the two sidewalls.

10. The small form factor transceiver module of claim 9, wherein at least one of the two stoppers is separated from the two sidewalls.

11. The small form factor transceiver module of claim 9, wherein at least one of the two stoppers is connected with one of the two sidewalls.

12. The small form factor transceiver module of claim 9, wherein the heatsink further comprises a plurality of fins separated from each other and connected between the bottom plate and the top plate, wherein the adhesive is connected between the mounting surface and the bottom plate of the heat sink, and wherein the bottom plate, the top plate and the fins are one piece formed, and both of the top plate and the bottom plate are separated from both of the two sidewalls by a plurality of side protrusions connecting to inner sides of the two sidewalls.

13. The small form factor transceiver module of claim 12, wherein the bottom plate has a first thickness, each of the two stoppers has a second thickness, the first thickness is equal to or larger than the second thickness.

14. The small form factor transceiver module of claim 9, wherein the connecting terminal points to an installing direction, the small form factor transceiver module further comprising:

a latch connected with an end of the base opposite to the installing direction.

15. The small form factor transceiver module of claim 9, wherein the mesh of grooves are arranged in a pattern of grids.

\* \* \* \* \*